(12) United States Patent
Tao et al.

(10) Patent No.: US 11,891,297 B2
(45) Date of Patent: Feb. 6, 2024

(54) MOTION CONTROL STRUCTURE AND ACTUATOR

(71) Applicant: AAC ACOUSTIC TECHNOLOGIES (SHENZHEN) CO., LTD., Shenzhen (CN)

(72) Inventors: Ze Tao, Shenzhen (CN); Wooicheang Goh, Singapore (SG); Zhan Zhan, Shenzhen (CN); Kahkeen Lai, Shenzhen (CN); Yang Li, Shenzhen (CN)

(73) Assignee: AAC ACOUSTIC TECHNOLOGIES (SHENZHEN) CO., LTD., Shenzhen (CN)

(*) Notice: Subject to any disclaimer, the term of this patent is extended or adjusted under 35 U.S.C. 154(b) by 812 days.

(21) Appl. No.: 16/995,791

(22) Filed: Aug. 17, 2020

(65) Prior Publication Data

US 2021/0002125 A1 Jan. 7, 2021

Related U.S. Application Data

(63) Continuation of application No. PCT/CN2020/080345, filed on Mar. 20, 2020.

(30) Foreign Application Priority Data

Jul. 5, 2019 (CN) .......................... 201910605916.2

(51) Int. Cl.
*B81B 3/00* (2006.01)

(52) U.S. Cl.
CPC .......... *B81B 3/0072* (2013.01); *B81B 3/0021* (2013.01); *B81B 3/0062* (2013.01)

(58) Field of Classification Search
CPC ... B81B 3/0062; B81B 3/0072; B81B 3/0021; B81B 2203/053; B81B 2203/051; B81B 2201/0235; H02N 1/008; G01C 19/5719; G01C 19/5712; G01C 19/5747; G01C 19/5642; G01C 19/42; G01C 19/5733;
(Continued)

(56) References Cited

U.S. PATENT DOCUMENTS

| | | | |
|---|---|---|---|
| 6,223,598 B1 * | 5/2001 | Judy ........................ | G01P 15/18 73/514.32 |
| 6,906,849 B1 * | 6/2005 | Mi ...................... | G02B 26/0841 359/223.1 |

(Continued)

*Primary Examiner* — Mouloucoulaye Inoussa
(74) *Attorney, Agent, or Firm* — W&G Law Group

(57) ABSTRACT

The present invention provides a motion control structure and a actuator. The motion control structure includes a motion platform, a first actuator having a first execution unit arranged on opposite sides of the motion platform along an X-axis direction and a second execution unit arranged on opposite sides of the motion platform along a Y-axis direction. The first execution unit includes a first actuating element displaced along the X-axis direction. The second execution unit includes a second actuating element displaced along the Y-axis direction. A second actuator surrounds an inner periphery of the motion platform and includes a third execution unit having an assembly portion displaced along the Z-axis direction. The motion control structure of the invention has the advantages that the motion platform can be driven to realize motion in six degrees of freedom.

11 Claims, 7 Drawing Sheets

(58) Field of Classification Search
CPC . G01C 19/574; G01P 15/0802; G01P 15/125; G01P 15/18; G01P 2015/084
USPC ...... 73/504.13, 504.12, 504.14, 510, 514.32, 73/504.02; 359/291, 230, 223.1, 214.1, 359/877; 257/415
See application file for complete search history.

(56) References Cited

U.S. PATENT DOCUMENTS

| | | | | |
|---|---|---|---|---|
| 6,915,693 B2* | 7/2005 | Kim | .................. | G01C 19/5762 73/504.12 |
| 2007/0131030 A1* | 6/2007 | Jeong | ................. | G01C 19/5747 73/504.12 |
| 2008/0115579 A1* | 5/2008 | Seeger | ............... | G01C 19/5712 73/504.12 |
| 2008/0276706 A1* | 11/2008 | Hartmann | .......... | G01C 19/5747 73/504.04 |
| 2009/0064780 A1* | 3/2009 | Coronato | .............. | G01P 15/125 73/504.08 |
| 2009/0090184 A1* | 4/2009 | Wang | .................... | G01P 15/125 73/514.24 |
| 2009/0139330 A1* | 6/2009 | Pavelescu | ............. | G01P 15/125 73/514.32 |
| 2010/0037691 A1* | 2/2010 | Jeong | ................. | G01C 19/5719 73/514.32 |
| 2010/0050767 A1* | 3/2010 | Higuchi | ............. | G01C 19/5719 73/504.12 |
| 2010/0058864 A1* | 3/2010 | Hsu | ........................ | G01P 15/125 73/514.32 |
| 2010/0122579 A1* | 5/2010 | Hsu | ......................... | G01P 15/18 73/514.32 |
| 2010/0139399 A1* | 6/2010 | Geiger | ................. | G01C 19/574 73/504.12 |
| 2010/0236327 A1* | 9/2010 | Mao | ................... | G01C 19/5719 73/504.12 |
| 2010/0263446 A1* | 10/2010 | Tamura | .............. | G01C 19/5712 73/504.12 |
| 2010/0272189 A1* | 10/2010 | Lee | .................... | H04N 21/4348 375/E7.027 |
| 2010/0307242 A1* | 12/2010 | Sakai | ................. | B81C 99/0045 438/51 |
| 2011/0023600 A1* | 2/2011 | Wrede | ................ | G01C 19/5712 73/504.13 |
| 2011/0271758 A1* | 11/2011 | Sakai | ................. | G01C 19/5747 73/504.12 |
| 2012/0055248 A1* | 3/2012 | Hammer | ............ | G01C 19/5747 73/504.12 |
| 2014/0260610 A1* | 9/2014 | McNeil | .............. | G01C 19/5712 73/504.12 |
| 2014/0311242 A1* | 10/2014 | Lee | ........................ | G01P 1/003 73/504.12 |
| 2014/0311247 A1* | 10/2014 | Zhang | ................. | G01C 19/574 73/652 |
| 2016/0033275 A1* | 2/2016 | Coronato | ........... | G01C 19/5719 73/504.12 |
| 2017/0122579 A1* | 5/2017 | Dingle | ................. | F24F 3/1405 |
| 2017/0363655 A1* | 12/2017 | Zhang | ................. | G01P 15/125 |
| 2018/0259335 A1* | 9/2018 | Giner | ................. | B81B 3/0048 |

* cited by examiner

MOTION CONTROL STRUCTURE AND ACTUATOR

FIELD OF THE PRESENT INVENTION

The present invention relates to the technical field of micro-electro-mechanical system, and more particularly to a motion control structure and an actuator adopting the motion control structure.

DESCRIPTION OF RELATED ART

A MEMS (micro-electro-mechanical system) motion control structure has a wide range of applications, such as MEMS switch, MEMS micromirror, MEMS speaker and so on. For some applications, such as MEMS micromirror and MEMS image stabilization, a degree of freedom is an important indicator of the MEMS motion control structure.

The existing MEMS motion control structure with multiple degrees of freedom has the following defects. (1) In some applications, such as an optical image stabilization, the existing motion control structure has fewer degrees of freedom. (2) To achieve multiple degrees of freedom, a connection between a drive device and a driven object is: drive device 1-drive device 2-driven object, so the motion accuracy and response speed of the driven object are reduced because of this indirect connection.

SUMMARY OF THE PRESENT INVENTION

One of the objects of the present invention is to provide a motion control structure which can directly drive a motion platform to achieve motion in six degrees of freedom, and the motion can be accurately and quickly transmitted to a driven object. Another object of the present invention is to provide an actuator which adopts the above-mentioned motion control structure.

One of the objects of the present invention is achieved by providing a motion control structure which includes a motion platform, a first actuator, and a second actuator. The motion platform is used for connecting with a driven object. The first actuator is used for driving the motion platform to translate along the X-axis or the Y-axis or rotate around the Z-axis. Wherein the first actuator surrounds an outer periphery of the motion platform. The first actuator includes a first execution unit arranged on opposite sides of the motion platform along the X-axis direction and a second execution units arranged on opposite sides of the motion platform along the Y-axis direction. The first execution unit includes a first actuating element connected to the motion platform. The first actuating element can be displaced along the X-axis direction. The second execution unit includes a second actuating element connected to the motion platform. The second actuating element can be displaced along the Y-axis direction. The second actuator 30 is used for driving the motion platform to translate along the Z-axis or rotate around the X-axis or rotate around the Y-axis. Wherein the second actuator surrounds an inner periphery of the motion platform and includes a third execution unit arranged corresponding to an inner edge of the motion platform. The third execution unit includes an assembly portion connected to the motion platform, and the assembly portion can displace along the Z-axis direction by an external drive.

As an improvement, the motion platform is formed by two different rectangles. The first execution unit is provided with two groups which are located on both sides of the motion platform along the X-axis direction, and each group of the first execution unit includes two first actuating elements arranged and spaced apart along the Y-axis direction. The second execution unit is provided with two groups which are located on both sides of the motion platform along the Y-axis direction, and each group of the second execution unit includes second actuating elements arranged and spaced along the X-axis direction. The third execution unit is provided with four groups, and the four groups of the third execution units are respectively arranged corresponding to four inner edges of the motion platform, and each group of the third execution unit includes one assembly portion.

As an improvement, each of the first execution units further includes first serpentine beams connecting the first actuating elements and the motion platform, and the first serpentine beams transmit the motion of the first actuating elements to the motion platform for driving the motion platform to displace along the X-axis.

As an improvement, each of the first execution units further includes second serpentine beams for restricting the displacement of the first actuating elements toward the Y-axis direction and three first anchoring portions arranged and spaced along the Y-axis direction. One first actuating element is arranged between every two adjacent first anchoring portions, and both sides of each first actuating element are connected with the first anchoring portion through the second serpentine beams, respectively.

As an improvement, each of the second execution units further includes third serpentine beams connecting the second actuating elements and the motion platform, and the third serpentine beams transmit the movement of the second actuating elements to the motion platform for displacing the motion platform along the Y-axis.

As an improvement, each of the second execution units further includes fourth serpentine beams for restricting the displacement of the second actuating elements in the X-axis direction, and three second anchoring portions arranged and spaced apart along the X-axis direction. One second actuating element is disposed between every two adjacent second anchoring portions, and both sides of each second actuating elements are connected to the second anchoring portions by the fourth serpentine beams, respectively.

As an improvement, each of the third execution units further includes a fifth serpentine beam connecting the assembly portion and the motion platform, and the fifth serpentine beam transmits the motion of the assembly portion to the motion platform for driving the motion platform to displace along the Z-axis.

As an improvement, each of the third execution units further includes a serpentine beam assembly and third anchoring portions arranged on both sides of the assembly portion, both sides of the assembly portion is connected with the third anchoring portions through the serpentine beam assemblies.

As an improvement, the serpentine beam assembly includes a first element for limiting displacement of the assembly portion in the X-axis direction and a second element for limiting displacement of the assembly portion in the Y-axis direction.

As an improvement, the assembly portion includes a first single body, a second single body, and sixth serpentine beams. The first single body is provided with a cavity, and the second single body is arranged in the cavity. Both sides of the second single body are connected to the inner side wall of the cavity through the sixth serpentine beams, the first single body is connected with the third anchoring portion through the serpentine beam assemblies, and the second single body is connected with the motion platform through the fifth serpentine beam.

Another object of the present invention is achieved by providing an actuator which includes: a plurality of electrostatic comb-tooth assemblies and the motion control structure as described above. Part of the electrostatic comb-tooth assemblies are connected to the first actuating elements for driving the first actuating elements to displace along the X-axis direction; part of the electrostatic comb-tooth assemblies are connected to the second actuating elements for driving the second actuating element to displace along the Y-axis direction, and part of the electrostatic comb-tooth assemblies are connected with the assembly portions for driving the assemblies to displace along the Z-axis direction.

Compared with the prior art, an external driver can directly drive the motion platform to achieve motion in six degrees of freedom through the motion control structure in the present invention. That is, the motion platform can be translated along the X-axis, Y-axis and Z-axis, and can be rotated around the X-axis, Y-axis and Z-axis, and the application range is wide. The first actuator and the second actuator are directly connected to the motion platform, so that the first actuator and the second actuator can directly transmit the motion to the motion platform. This direct transmission method allows the motion to be accurately and quickly transmitted to the driven object, and a fast response speed is fast.

DETAILED DESCRIPTION OF THE EXEMPLARY EMBODIMENT

The present invention will be further described in detail with reference to the drawings and embodiments hereafter.

It should be noted that all directional indicators (such as upper, lower, left, right, front, back, inside, outside, top, bottom, etc.) in the embodiments of the present invention are only used for explaining the relative positional relationships among the various components in a specific posture (shown in the Figs). If the specific posture changes, the directional indicator will also changes accordingly.

It should also be noted that when an element is referred as "fixed on" or "arranged on" another element, the element may be directly fixed on the other element or a centering element may exist at the same time. When an element is referred as "connected to" another element, it can be directly connected to another element or a centering element may exist at the same time.

Figure 1:
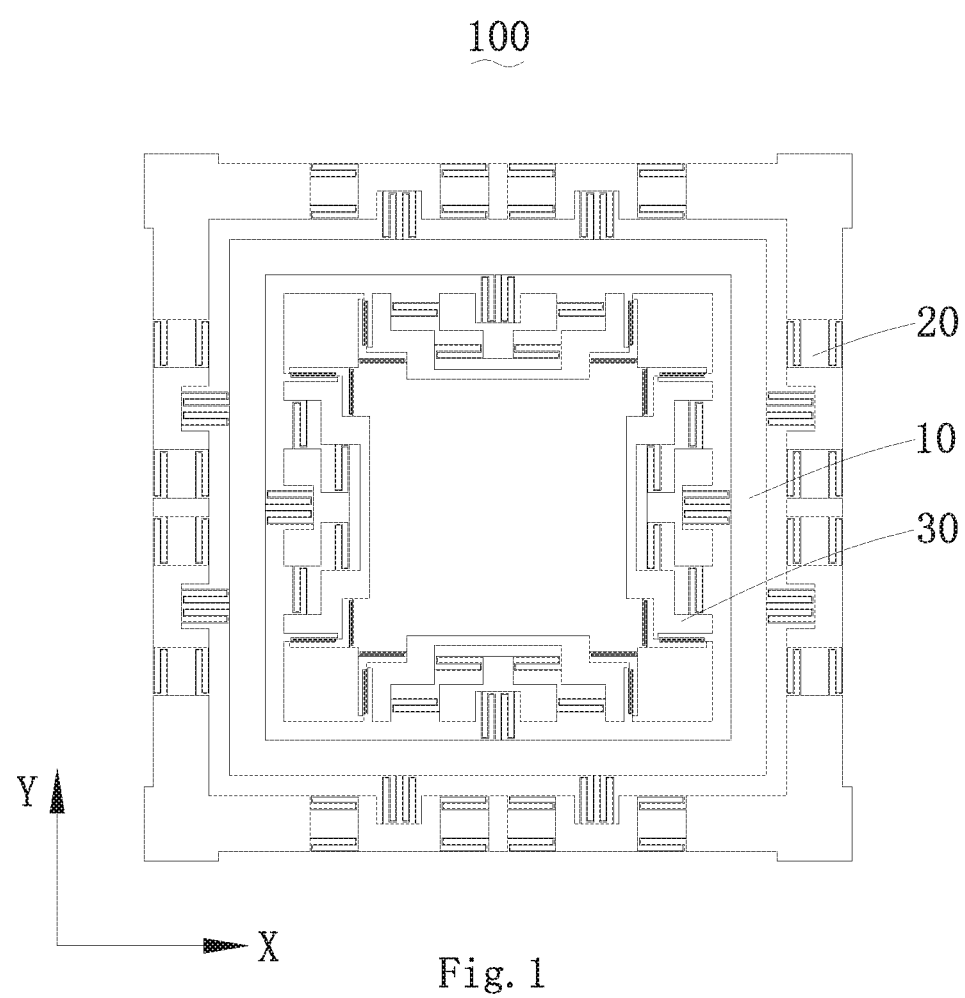
FIG. 1 is an isometric view of a motion control structure according to an embodiment of the present invention.
Figure 2:
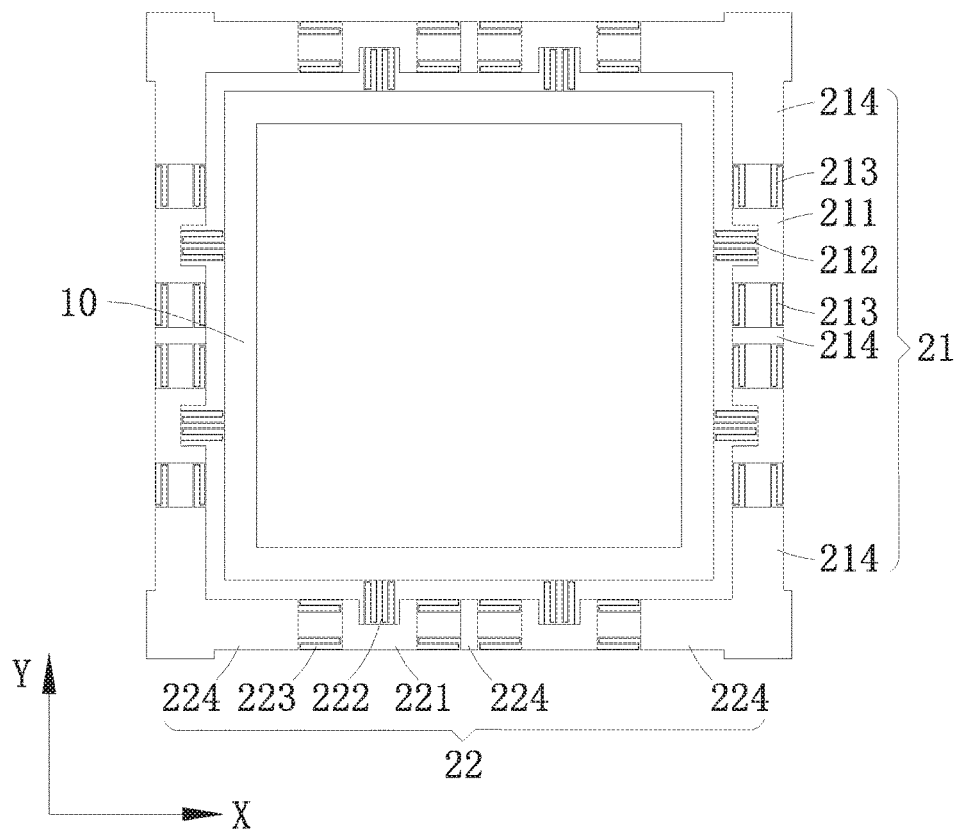
FIG. 2 is an isometric view of a first actuator and the motion platform according to the embodiment of the present invention.
Figure 3:
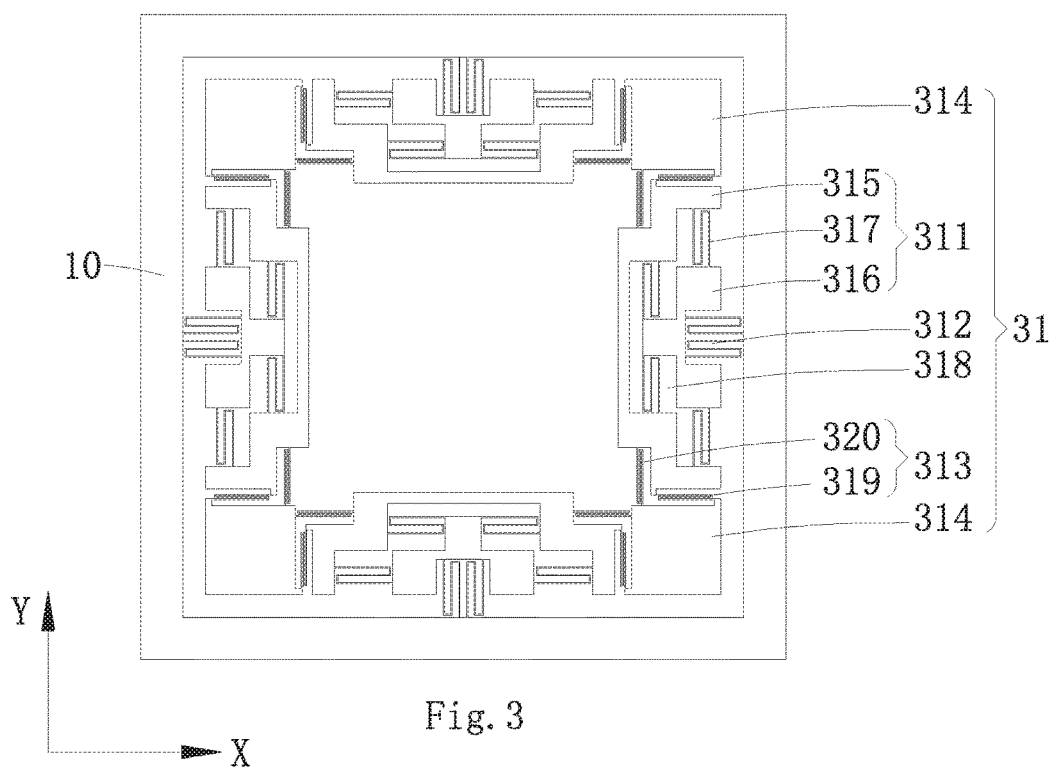
FIG. 3 is an isometric view of a second actuator and the motion platform according to the embodiment of the present invention.

Referring to FIG. 1 to FIG. 3, an embodiment of the present invention provides a motion control structure 100 which includes a motion platform 10, a first actuator 20, and a second actuator 30. The motion platform 10 is used for connecting with a driven object. The first actuator 20 is used for driving the motion platform 10 to translate along the X-axis or along the Y-axis or rotate around the Z-axis. The first actuator 20 surrounds an outer periphery of the motion platform 10. The first actuator 20 includes a first execution unit 21 arranged on opposite sides of the motion platform 10 along the X-axis direction, and a second execution unit 22 arranged on opposite sides of the motion platform 10 along the Y-axis direction. The first execution unit 21 includes a first actuating element 211 connected to the motion platform 10. The first actuating element 221 can be displaced along the X-axis direction. The second execution unit 22 includes a second actuating element 221 connected to the motion platform 10. The second actuating element 221 can be displaced along the Y-axis direction. The second actuator 30 is used for driving the motion platform 10 to translate along the Z-axis or rotate around the X-axis or rotate around the Y-axis. The second actuator 30 surrounds an inner periphery of the motion platform 10. The second actuator 30 includes a third execution unit 31 arranged corresponding to an inner edge of the motion platform 10. The third execution unit 31 includes an assembly portion 311 connected to the motion platform 10. The assembly portion 311 can be displaced along the Z-axis direction by an external driver.

In the present embodiment, the first actuator 20 and the second actuator 30 are directly connected to the motion platform 10, so the first actuator 20 and the second actuator 30 can directly transmit the motion to the motion platform 10. This direct transmission method allows the motion to be accurately and quickly transmitted to a driven object, and a response speed is fast.

As an improved way of the present embodiment, the motion platform 10 is formed by two different rectangles. The first execution unit 21 is provided with two groups which are located on both sides of the motion platform 10 along the X-axis direction, and each group of the first execution units 21 includes two first actuating elements 211 arranged and spaced apart along the Y-axis direction. The second execution unit 22 is provided with two groups which are located on both sides of the motion platform along 10 the Y-axis direction, and each group of the second execution units 22 includes second actuating elements 221 arranged and spaced along the X-axis direction. The third execution unit 31 is provided with four groups, and the four groups of the third execution units 31 are respectively arranged corresponding to four inner edges of the motion platform 10, and each group of the third execution unit 31 includes one assembly portion 311.

With the above arrangement, the motion control structure 100 can directly drive the motion platform 10 to achieve motion in six degrees of freedom through the driving of an external driver. The six degrees of freedom is that the motion platform translates along the X-axis, Y-axis and Z-axis and rotates around the X-axis, Y-axis and Z-axis, respectively. The following six embodiments are used to explain respectively how the motion control structure 100 drives the motion platform 10 indirectly to achieve motion in six degrees of freedom.

Figure 4:
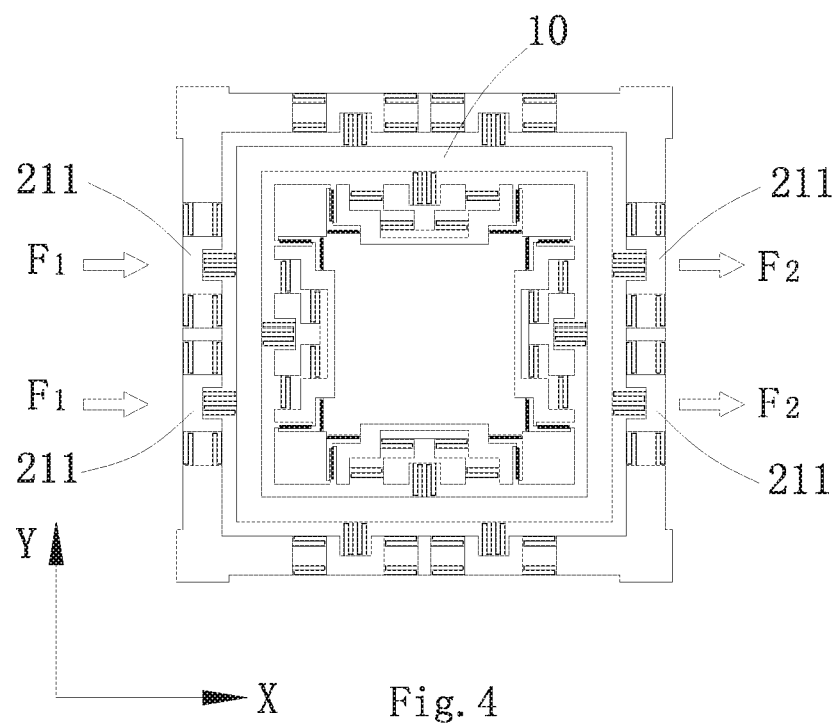
FIG. 4 is an isometric view of displacement of the motion control structure along the X-axis direction according to an embodiment of the present invention.

Please refer to FIG. 4, an example is used to illustrate how the first execution units 21 drive the motion platform 10 to displace along the X-axis direction. The actuating elements 211 on the left side of FIG. 4 are pushed by external forces F1, and the two actuating elements 211 on the right side of FIG. 4 are pulled by external forces F2. The two first actuating elements 211 disposed on the left side of FIG. 4 are cooperated with the two first actuating elements 211 disposed on the right side of FIG. 4 for driving the motion platform 10 to displace toward a positive direction of the X-axis. On the contrary, the motion platform 10 is driven to displace toward a negative direction of the X-axis.

Figure 5:
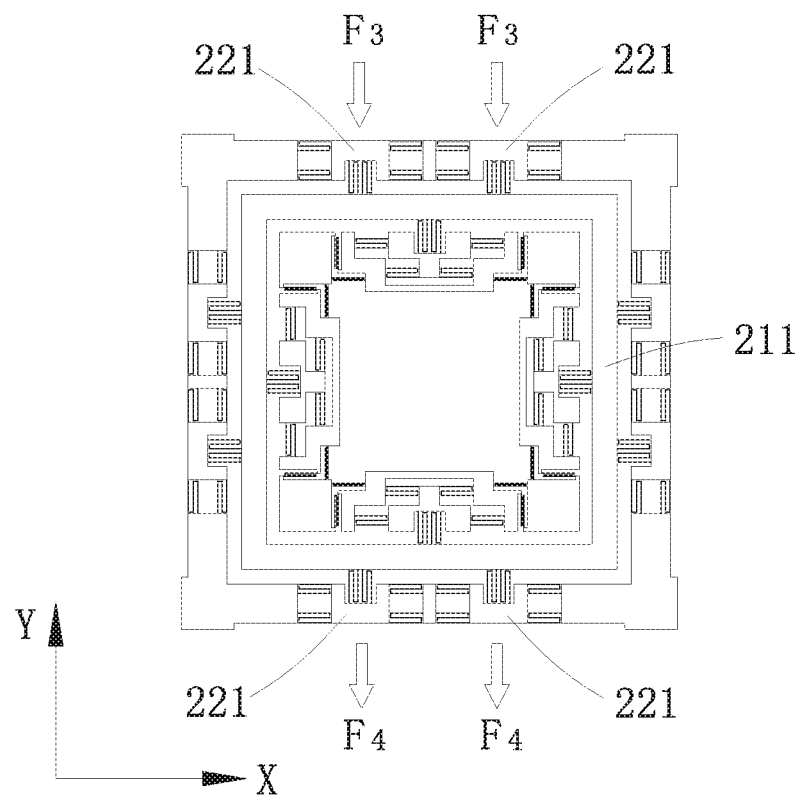
FIG. 5 is an isometric view of displacement of the motion control structure along the Y-axis direction according to an embodiment of the present invention.

Please refer to FIG. 5, an example is used to illustrate how the second execution units 22 drive the motion platform 10 to displace along the Y-axis direction. The two second actuating elements 221 located on above the FIG. 5 are pushed by external forces F3, and the two second actuating elements 221 located below FIG. 5 are pulled by external forces F4. The two second actuating elements 221 located above FIG. 5 are cooperated with the two second actuating elements 221 located below FIG. 5 for driving the motion platform to displace toward a negative direction of the Y-axis. On the contrary, the motion platform 10 is driven to displace toward a positive direction of the Y-axis.

Figure 6:
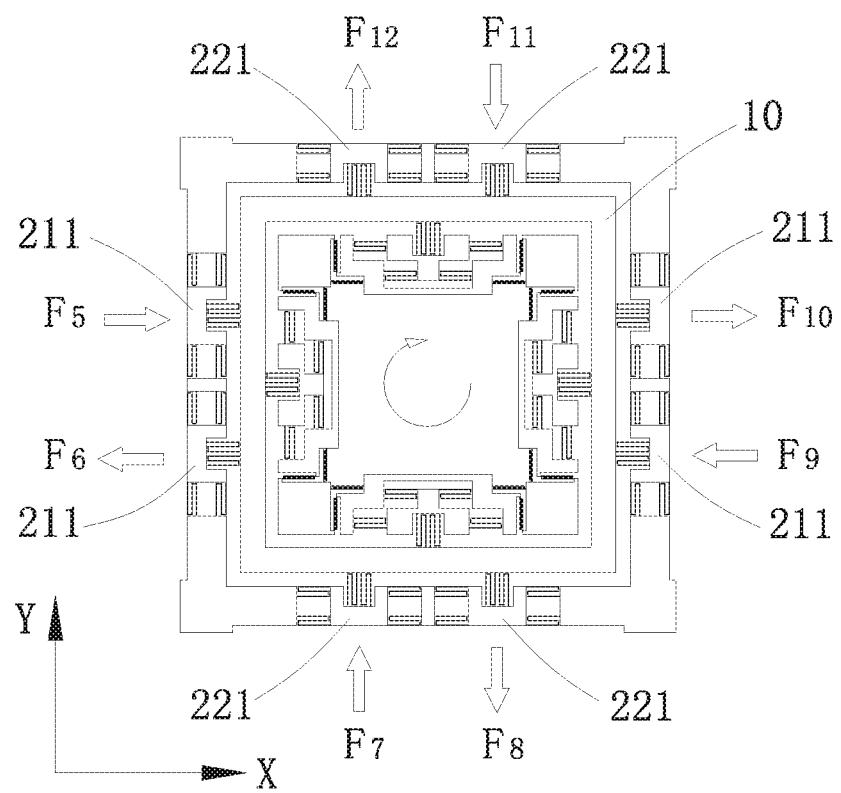
FIG. 6 is an isometric view of the motion control structure rotating around the Z-axis according to an embodiment of the present invention.

Please refer to FIG. 6, an example is used to illustrate how the first execution units 21 are cooperated with the second execution units 22 to drive the motion platform 10 to rotate around the Z-axis. The two first actuating elements 211 located on the left side of FIG. 6 are subjected to external forces F5 and F6, and the two second actuating elements 221 located below FIG. 6 are subjected to external forces F7 and F8. The two first actuating elements 211 located on the right side of FIG. 6 are subjected to external forces F9 and F10, and the two second actuating elements 221 located above the FIG. 6 are subjected to external forces F11 and F12. Four first actuating elements 211 are cooperated with four second actuating elements 221 for driving the motion platform 10 to rotate around the Z-axis clockwisely. On the contrary, the motion platform 10 is driven to rotate around the Z-axis counterclockwisely.

Figure 7:
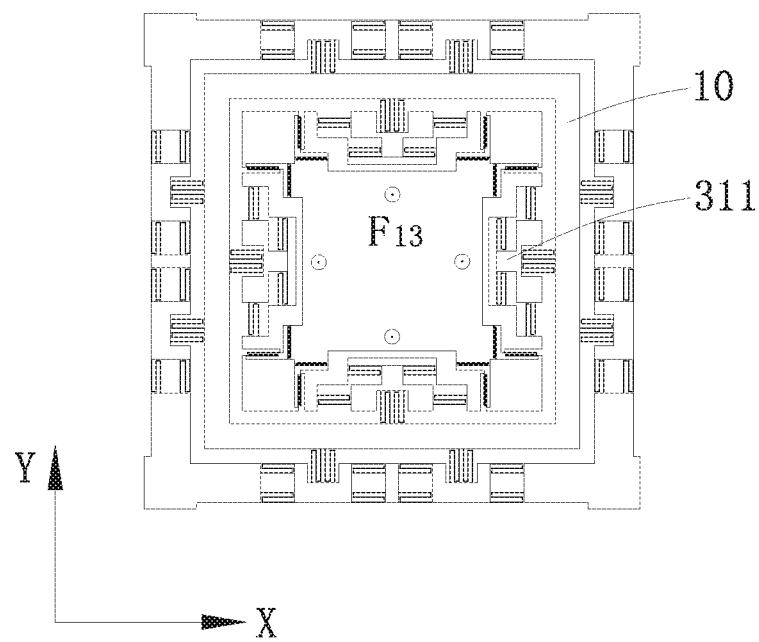
FIG. 7 is an isometric view of displacement of the motion control structure along the Z-axis direction according to an embodiment of the present invention.

Please refer to FIG. 7, an example is used to illustrate how the third execution units 31 drive the motion platform 10 to displace along the Z-axis direction. The four assembly portions 311 are respectively subjected to an outward force F13 perpendicular to FIG. 7, thus to drive the motion platform 10 to displace along a positive direction of the Z-axis. On the contrary, the motion platform 10 is driven to displace toward a negative direction of the Z-axis.

Figure 8:
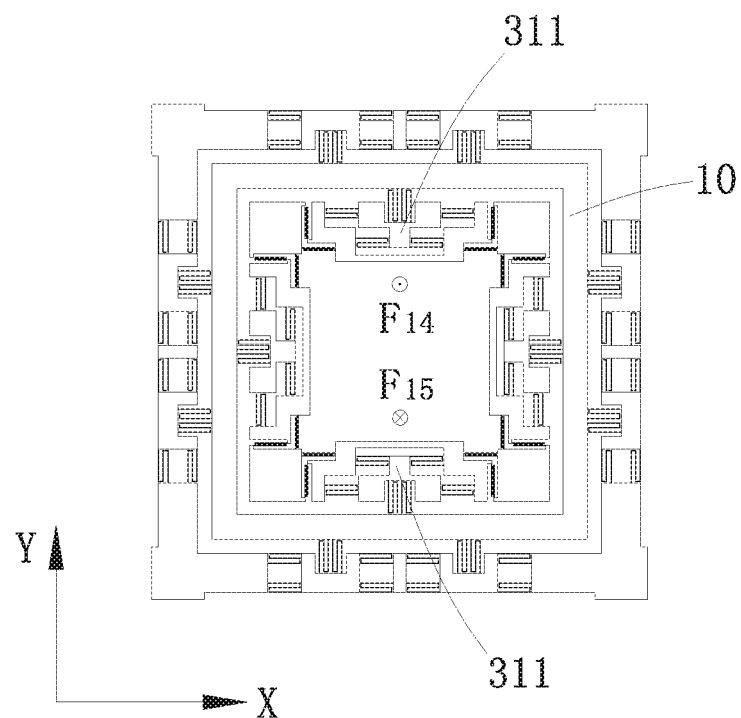
FIG. 8 is an isometric view of the motion control structure rotating around the X-axis according to an embodiment of the present invention.

Please refer to FIG. 8, an example is used to illustrate how the third execution units 31 drive the motion platform 10 to rotate around the X-axis direction. The assembly portion 311 located above FIG. 8 is subjected to an outward force F14 perpendicular to FIG. 8, and the assembly portion 311 located below FIG. 8 is subjected to an inward force F15 perpendicular to the FIG. 8. The assembly portion 311 located above FIG. 8 is cooperated with the assembly portion 311 located below FIG. 8 for driving the motion platform 10 to rotate around the X-axis clockwisely. On the contrary, the motion platform 10 is driven to rotate around the X-axis counterclockwisely.

Figure 9:
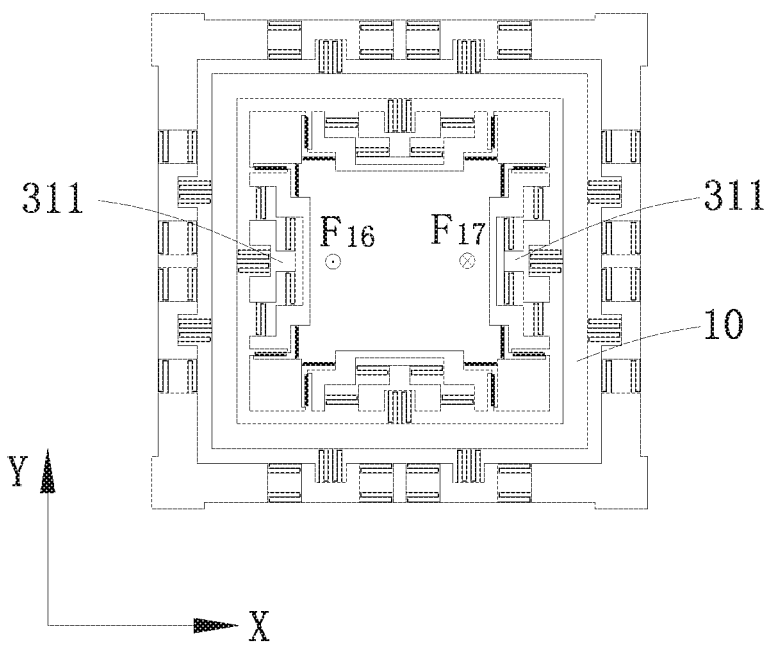
FIG. 9 is an isometric view of the motion control structure rotating around the Y-axis according to an embodiment of the present invention.

Please refer to FIG. 9, an example is used to illustrate how the third execution units 31 drive the motion platform 10 to rotate around the Y-axis direction. The assembly portion 311 disposed on the left side of FIG. 9 is subjected to an outward force F16 perpendicular to FIG. 8, and the assembly portion 311 is subjected to an inward force F17 perpendicular to the FIG. 9. The assembly portion 311 disposed on the left side of FIG. 9 is cooperated with the assembly portion 311 disposed on the right side of FIG. 9 for driving the motion platform 10 to rotate around the Y-axis clockwisely. On the contrary, the motion platform 10 is driven to rotate around the Y-axis counterclockwisely.

Please refer to FIG. 1 to FIG. 3 again, as an improvement of the present embodiment, each first execution unit 21 further includes first serpentine beams 212, and the first actuating elements 211 are connected with the motion platform 10 through the first serpentine beams 212. With the aforementioned arrangement, the first serpentine beams 212 transmit the motion of the first actuating elements 211 to the motion platform 10 for driving the motion platform 10 to displace in the X-axis direction.

As an improvement of the present embodiment, each first execution unit 21 further includes second serpentine beams 213 and three first anchoring portions 214 arranged and spaced apart along the Y-axis direction. One first actuating element 211 is arranged between every adjacent two first anchoring portions 214, and both sides of each first actuating element 211 are connected to the first anchoring portions 214 through the second serpentine beams 213 respectively. The first anchoring portions 214 are used for fixing the first execution units 21, for example, the first execution units 21 are fixed on a circuit board via the first anchoring portions 214. With the aforementioned arrangement, the second serpentine beams 213 can suppress the motion of the first actuating elements 211 in the Y-axis direction, so that the driving direction of the first actuating elements 211 is single, thus to improve the driving stability and to reduce the controlling difficulty of the motion platform 10 at the same time.

As an improvement of the present embodiment, each second execution unit 22 further includes third serpentine beams 222, and the second actuating elements 221 are connected with the motion platform 10 through the third serpentine beams 222. With the aforementioned arrangement, the third serpentine beams 222 transmit the motion of the second actuating elements 221 to the motion platform 10 to displace the motion platform 10 in the Y-axis direction.

As an improvement of the present embodiment, each second execution unit 22 further includes fourth serpentine beams 223 and three second anchoring portions 224 arranged and spaced apart along the X-axis direction. One second actuating element 221 is arranged between every adjacent two second anchoring portions 224, and both sides of each second actuating element 221 are connected with the second anchoring portions 224 through the fourth serpentine beams 223 respectively. The second anchoring portions 224 are used for fixing the second execution units 22, for example, the second execution units 22 are fixed on the circuit board by the second anchoring portions 224. With the aforementioned arrangement, the fourth serpentine beams 223 can suppress the motion of the second actuating elements 221 in the X-axis direction, so that the driving direction of the second actuating elements 221 is single, thus to improve the driving stability, and to reduce the controlling difficulty of the motion platform 10 at the same time.

Furthermore, when the first serpentine beams 212 transmit the motion of the first actuating elements 211 to the motion platform 10 for driving the motion platform 10 to displace along the X-axis direction, on the one hand, the third serpentine beams 222 connecting the motion platform 10 and the second actuating element 221 absorb the displacement of the motion platform 10. Therefore, the displacement of the motion platform 10 will cause deformation of the third serpentine beams 222, but will not cause displacement of the second actuating element 221. Without affecting the displacement of the motion platform 10, the third serpentine beams 222 will not transmit the motion to the second actuating elements 221. On the other hand, the second actuating elements 221 which are connected with the second anchoring portion 224 through the fourth serpentine beams 223 cannot displace along the X-axis direction, so the motion independence of the first actuating elements 211 and the second actuating elements 221 are ensured, thereby improving the stability of electrostatic driving and reducing the controlling difficulty of motion platform at the same time.

Furthermore, when the third serpentine beams 222 transmit the motion of the second actuating elements 221 to the motion platform 10, for driving the motion platform 10 to displace along the Y-axis direction, on the one hand, the first serpentine beams 212 connecting the motion platform 10 and the first actuating element 211 absorb the displacement of the motion platform 10, so the displacement of the motion platform 10 will cause deformation of the first serpentine beams 212, but will not cause displacement of the first actuating elements 211. Without affecting the displacement of the motion platform 10, the first serpentine beams 212 will not transmit the motion to the first actuating elements 211. On the other hand, the first actuating elements 211 which are connected with the first anchoring portion 214 through the second serpentine beams 213 cannot displace along the Y-axis direction, so the motion independence of the first actuating elements 211 and the second actuating elements 221 are ensured, thereby improving the stability of electrostatic driving and reducing the controlling difficulty of the motion platform at the same time.

As an improvement of the present embodiment, each third execution unit 31 further includes an assembly portion 311, a fifth serpentine beam 312, a serpentine beam assembly 313, and third anchoring portions 314 arranged on both sides of the assembly portion 311. The assembly portion 311 includes a first single body 315, a second single body 316, and sixth serpentine beams 317. The first single body 315 is provided with a cavity 318, and the second single body 316 is arranged in the cavity 318. Both sides of the second single body 316 are connected to the inner side wall of the cavity 318 through the sixth serpentine beams 317, the first single body 315 is connected with the third anchoring portion 314 through the serpentine beam assembly 313, and the second single body 316 is connected with the motion platform 10 through the fifth serpentine beam 312.

The assembly portion 311 is connected with the motion platform 10 through the fifth serpentine beam 312. When the motion platform 10 is displaced in the Y-axis direction, the fifth serpentine beam 312 is deformed, and the first single body 315 is restricted from being displaced by the serpentine beam assembly 313. When the motion platform 10 is displaced in the X-axis direction, the sixth serpentine beams 317 are deformed, and the first single body 315 is restricted from being displaced by the serpentine beam assembly 313. Therefore, the motion of the motion platform 10 in the X-axis and Y-axis direction will not be transmitted to the first single body 315, thereby ensuring the motion independence of the X/Y-axis and the Z-axis, and improving the stability of electrostatic driving, thus to reduce controlling difficulty of the motion platform 10.

Both sides of the assembly portion 311 are connected with the third anchoring portions 314 through the serpentine beam assemblies 313. The serpentine beam assemblies 313 restrict the displacement of the first single body 315 in the X-axis and Y-axis directions, so that the first single body 315 can be displaced only in the Z-axis direction, thus to ensure that the driving direction of the first single body 315 is single and the stability of the electrostatic driving is improved, thereby reducing the controlling difficulty of the motion platform 10.

Figure 10:
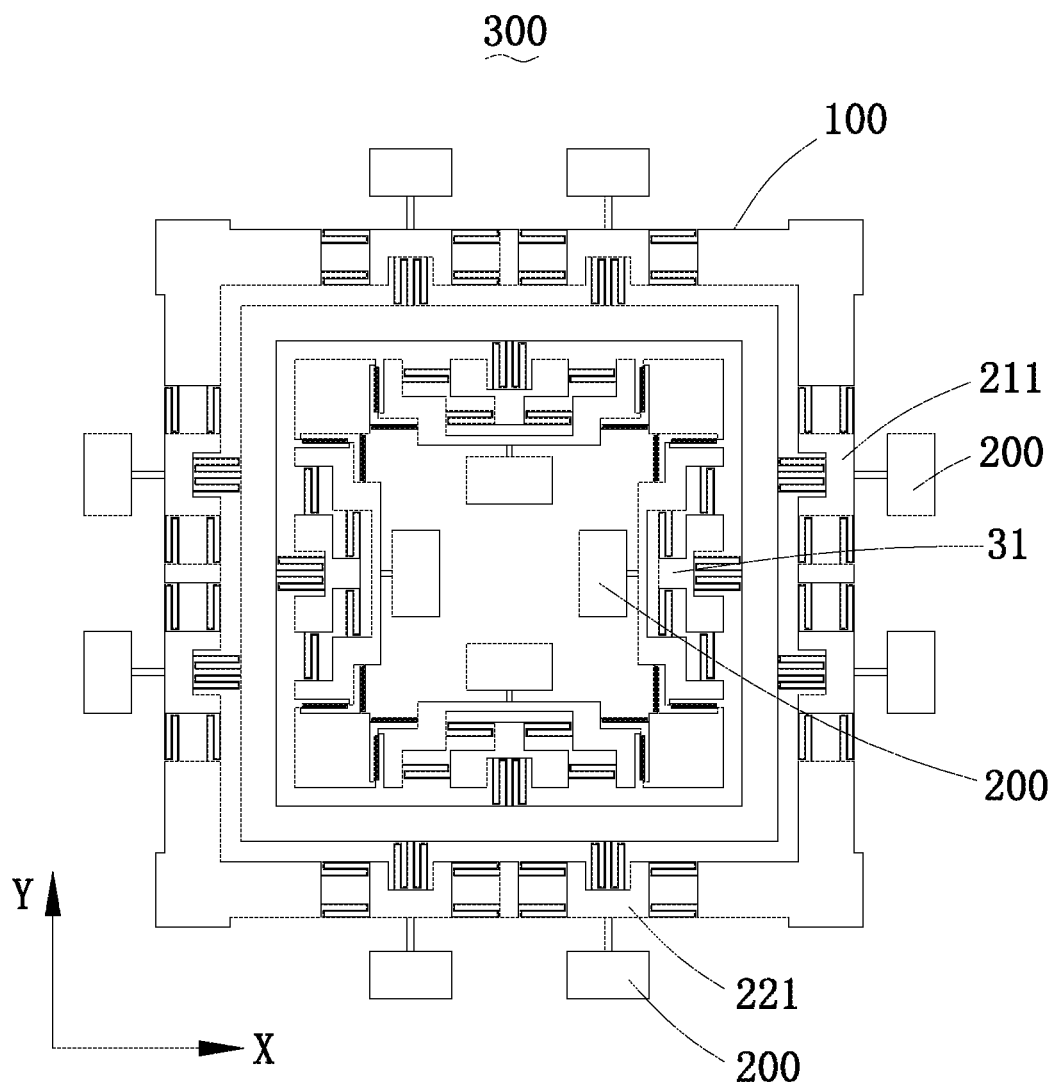
FIG. 10 is an isometric view of a driving mechanism according to the embodiment of the present invention.

Please refer to FIG. 10, the embodiment of the present invention further provides an actuator 300 which includes the motion control structure 100 as described above and twelve electrostatic comb-tooth assemblies 200. The four electrostatic comb-tooth assemblies 200 are respectively connected to the four first actuating elements 211 for driving the first actuating element 211 to displace along the X-axis direction; the four electrostatic comb-tooth assemblies 200 are respectively connected to the four second actuating elements 221 for driving the second actuating elements 221 to displace along the Y-axis direction, and the four electrostatic comb-tooth assemblies 200 are respectively connected to the four assembly portions 311 for driving the assembly portions 311 to displace in the Z-axis direction. Understandably, the number of electrostatic comb-tooth assemblies 200 are not limited to twelve, and the number of electrostatic comb-tooth assemblies 200 may be determined according to the number of the first actuating elements 211, the second actuating elements 221, and the assembly portions 311. The electrostatic comb-tooth assembly 200 may be a common transverse comb-tooth structure or a vertical comb-tooth structure, which is not limited in the embodiment of the present invention and may be selected according to actual applications.

Figure 11:
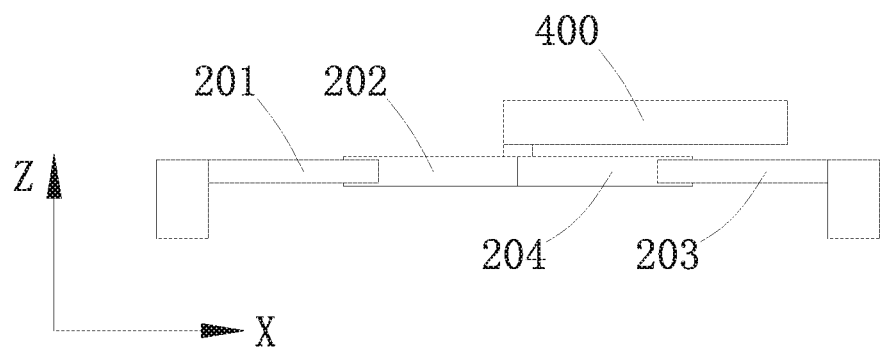
FIG. 11 is an isometric view of an electrostatic comb-tooth assembly according to the embodiment of the present invention.
Figure 12:
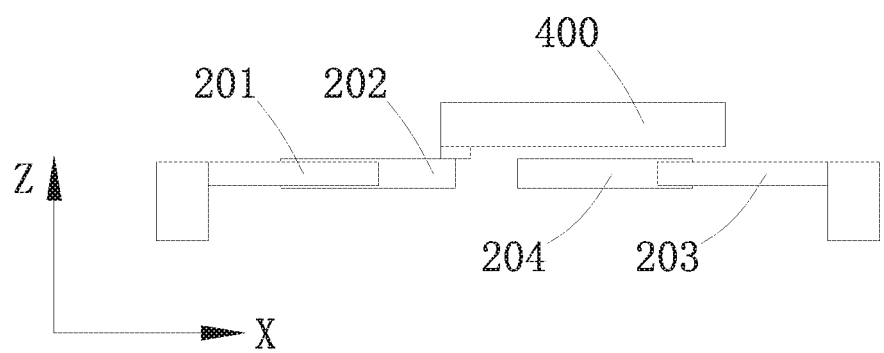
FIG. 12 is an isometric view of the electrostatic comb-tooth assembly driving a driven object to translate.
Figure 13:
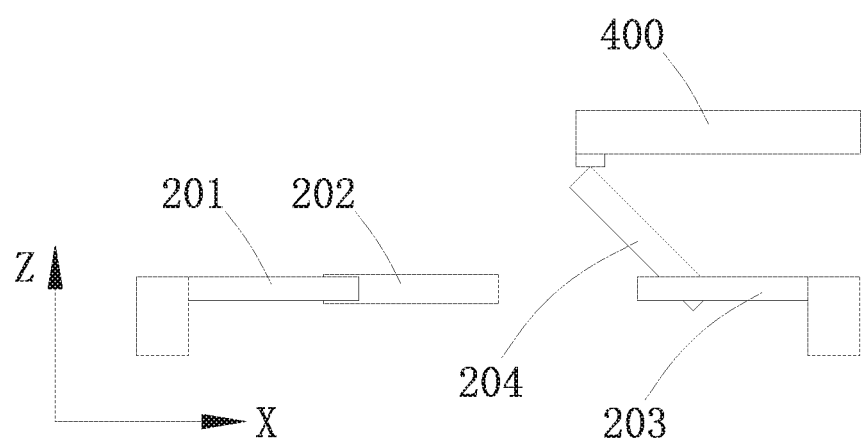
FIG. 13 is an isometric view of the electrostatic comb-tooth assembly driving the driven object to move vertically.

Please refer to FIG. 11 to FIG. 13, each electrostatic comb-tooth assembly 200 includes a first fixed tooth 201, a first movable tooth 202, a second fixed tooth 203, and a second movable tooth 204. The first movable tooth 202 is interlaced with the first fixed tooth 201, and the second movable teeth 204 is interlaced with the second fixed teeth 203. The first movable tooth 202 or the second movable tooth 204 drives a driven object 400 to move through driving the motion control structure 100. When the driven object 400 is required to be driven to translate, a predetermined electrical signal is supplied to the electrostatic comb-tooth assembly 200, and the first movable tooth 202 pulls the driven object 400 to displace toward the first fixed tooth 201, thus to pull the driven object 400 to translate. When the driven object 400 is required to be driven to move vertically, a predetermined electric signal is supplied to the electrostatic comb-tooth assembly 200. The end of the second movable tooth 204 connecting to the driven object 400 is upturned, so that the driven object 400 is driven to displace in a vertical direction. In this embodiment, the driven object 400 is the first actuating elements 211, the second actuating elements 221 or the assembly portion 311. It should be noted that the structures of the electrostatic comb-tooth assembly 200 in FIG. 11 to FIG. 13 are only used to illustrate the displacement of the driven object 400, which are not limit to its specific structure, and the motion control structure 100 is not drawn specifically here.

The above description is only preferred embodiment of the present invention, and it should be noted that those skilled in the art can also make improvements without departing from the inventive concept of the present invention, but these improvements all belong to the protection scope of the invention.

What is claimed is:

1. A motion control structure, including:
   a motion platform, used for connecting with a driven object;
   a first actuator, used for driving the motion platform to translate along an X-axis or a Y-axis or rotate around a Z-axis, wherein the first actuator surrounds an outer periphery of the motion platform, and the first actuator includes a first execution unit arranged on opposite sides of the motion platform along the X-axis direction and a second execution unit arranged on opposite sides of the motion platform along the Y-axis direction; the first execution unit includes a first actuating element connected to the motion platform, and the first actuating element can be displaced along the X-axis direction; the second execution unit includes a second actuating element connected to the motion platform, and the second actuating element can be displaced along the Y-axis direction; and
   a second actuator, used for driving the motion platform to translate along the Z-axis or rotate around the X-axis or the Y-axis, wherein the second actuator surrounds an inner periphery of the motion platform, and the second actuator includes a third execution unit arranged corresponding to an inner edge of the motion platform; the third execution unit includes an assembly portion connected to the motion platform, and the assembly portion can be displaced along the Z-axis direction;
   wherein each of the third execution units further includes a fifth serpentine beam connecting the assembly portion and the motion platform, the fifth serpentine beam transmits the motion of the assembly portion to the motion platform for driving the motion platform to displacing along the Z-axis; each of the third execution units further includes a serpentine beam assembly and third anchoring portions arranged on both sides of the assembly portion, both sides of the assembly portion is connected with the third anchoring portions through the serpentine beam assemblies; the assembly portion includes a first single body, a second single body, and sixth serpentine beams; the first single body is provided with a cavity, and the second single body is arranged in the cavity; both sides of the second single body are connected to the inner side wall of the cavity through the sixth serpentine beams, the first single body is connected with the third anchoring portion through the serpentine beam assemblies, and the second single body is connected with the motion platform through the fifth serpentine beam.

2. The motion control structure according to claim 1, wherein the motion platform is formed by two different rectangles, the first execution unit is provided with two groups which are located on both sides of the motion platform along the X-axis direction, each group of the first execution units includes two first actuating elements arranged and spaced apart along the Y-axis direction; the second execution unit is provided with two groups which are located on both sides of the motion platform along the Y-axis direction, each group of the second execution units includes second actuating elements arranged and spaced along the X-axis direction; the third execution unit is provided with four groups, and the four groups of the third execution units are respectively arranged corresponding to four inner edges of the motion platform, and each group of the third execution units includes one assembly portion.

3. The motion control structure according to claim 1, wherein each of the first execution units further includes first serpentine beams connecting the first actuating elements and the motion platform, the first serpentine beams transmit the motion of the first actuating elements to the motion platform for driving the motion platform to displace along the X-axis.

4. The motion control structure according to claim 2, wherein each of the first execution units further includes first serpentine beams connecting the first actuating elements and the motion platform, the first serpentine beams transmit the motion of the first actuating elements to the motion platform for driving the motion platform to displace along the X-axis.

5. The motion control structure according to claim 3, wherein each of the first execution units further includes second serpentine beams for restricting the displacement of the first actuating elements toward the Y-axis direction and three first anchoring portions arranged and spaced along the Y-axis direction; one first actuating element is arranged between every two adjacent first anchoring portions, and both sides of each first actuating element are connected with the first anchoring portion through the second serpentine beams, respectively.

6. The motion control structure according to claim 4, wherein each of the first execution units further includes second serpentine beams for restricting the displacement of the first actuating elements toward the Y-axis direction and three first anchoring portions arranged and spaced along the Y-axis direction; one first actuating element is arranged between every two adjacent first anchoring portions, and both sides of each first actuating element are connected with the first anchoring portion through the second serpentine beams, respectively.

7. The motion control structure according to claim 1, wherein each of the second execution units further includes third serpentine beams connecting the second actuating elements and the motion platform, the third serpentine beams transmit the motion of the second actuating elements to the motion platform for driving the motion platform to displace along the Y-axis.

8. The motion control structure according to claim 2, wherein each of the second execution units further includes third serpentine beams connecting the second actuating elements and the motion platform, the third serpentine beams transmit the motion of the second actuating elements to the motion platform for driving the motion platform to displace along the Y-axis.

9. The motion control structure according to claim 7, wherein each of the second execution units further includes fourth serpentine beams for restricting the displacement of the second actuating element in the X-axis direction, and three second anchoring portions arranged and spaced apart along the X-axis direction; one second actuating element is disposed between every two adjacent second anchoring portions, and both sides of each second actuating elements are connected to the second anchoring portions through the fourth serpentine beams, respectively.

10. The motion control structure according to claim 1, wherein the serpentine beam assembly includes a first element for limiting displacement of the assembly portion in the X-axis direction and a second element for limiting displacement of the assembly portion in the Y-axis direction.

11. An actuator, including a plurality of electrostatic comb-tooth assemblies and a motion control structure according to claim 1, wherein part of the electrostatic comb-tooth assemblies are connected to the first actuating elements for driving the first actuating elements to displace along the X-axis direction, part of the electrostatic comb-tooth assemblies are connected to the second actuating elements for driving the second actuating element to displace along the Y-axis direction, and part of the electrostatic comb-tooth assemblies are connected with the assembly portions for driving the assemblies to displace along the Z-axis direction.

* * * * *